US012648301B2

(12) United States Patent
Lee et al.

(10) Patent No.: US 12,648,301 B2
(45) Date of Patent: Jun. 2, 2026

(54) ORGANIC LIGHT EMITTING DISPLAY DEVICE

(71) Applicant: LG Display Co., Ltd., Seoul (KR)

(72) Inventors: Bokyoung Lee, Paju-si (KR); Yongil Kim, Paju-si (KR); Hyeona Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 316 days.

(21) Appl. No.: 18/213,527

(22) Filed: Jun. 23, 2023

(65) Prior Publication Data

US 2024/0008310 A1     Jan. 4, 2024

(30) Foreign Application Priority Data

Jun. 30, 2022    (KR) ........................ 10-2022-0080594

(51) Int. Cl.
H10K 59/121        (2023.01)
H10K 59/80         (2023.01)

(52) U.S. Cl.
CPC ..... H10K 59/1213 (2023.02); H10K 59/1216 (2023.02); H10K 59/8792 (2023.02)

(58) Field of Classification Search
CPC ............. H10K 59/1213; H10K 59/123; H10K 59/124; H10K 59/8792; H10K 59/126; H10K 59/1216; H10D 86/60; H10D 30/6723; H10D 86/481; H10D 86/423; H10D 86/451; H10D 86/425
See application file for complete search history.

(56) References Cited

U.S. PATENT DOCUMENTS

| | | | |
|---|---|---|---|
| 11,114,472 B2 | 9/2021 | Kim et al. | |
| 11,367,815 B2 | 6/2022 | Han et al. | |
| 2020/0203388 A1 | 6/2020 | Kim et al. | |
| 2021/0066555 A1 | 3/2021 | Han et al. | |
| 2022/0199742 A1* | 6/2022 | Jeon ...................... H10K 59/88 |
| 2022/0320391 A1 | 10/2022 | Han et al. | |

(Continued)

FOREIGN PATENT DOCUMENTS

| | | | |
|---|---|---|---|
| EP | 3629383 A1 | 4/2020 |
| KR | 10-1463032 B1 | 11/2014 |
| KR | 10-2020-0077680 A | 7/2020 |

(Continued)

OTHER PUBLICATIONS

Ministry of Intellectual Property of Korea, Office Action, Korean Patent Application No. 10-2022-0080594, Nov. 5, 2025, 15 pages.

*Primary Examiner* — Thanhha S Pham
(74) *Attorney, Agent, or Firm* — Fenwick & West LLP

(57)        ABSTRACT

Provided is an organic light emitting display device including a light emitting element, a driving transistor configured to provide a driving current to the light emitting element and including a first oxide semiconductor layer and a first gate electrode on disposed the first oxide semiconductor layer, a first light blocking layer overlapping the first oxide semiconductor layer under the first oxide semiconductor layer, and at least one insulating layer disposed between the first light blocking layer and the first gate electrode and made of a hydrogen-free silicon nitride material. Accordingly, it is possible to increase an S-factor of the driving transistor using the oxide semiconductor layer and secure performance.

24 Claims, 7 Drawing Sheets

(56) References Cited

U.S. PATENT DOCUMENTS

2023/0157112 A1 * 5/2023 Lim .................. H10K 59/1213
345/204

FOREIGN PATENT DOCUMENTS

| KR | 10-2021-0027678 | A | | 3/2021 |
| KR | 20210086247 | | * | 7/2021 |
| KR | 20220011246 | | * | 1/2022 |

* cited by examiner

FIG. 7

ORGANIC LIGHT EMITTING DISPLAY DEVICE

CROSS REFERENCE TO RELATED APPLICATION

The present application claims the benefit of Korean Patent Application No. 10-2022-0080594, filed on Jun. 30, 2022, in the Korean Intellectual Property Office, the entire contents of which is incorporated herein for all purposes by this reference.

TECHNICAL FIELD

The present disclosure relates to an organic light emitting display device, and more particularly, to an organic light emitting display device including hybrid-type thin film transistors fabricated using different types of semiconductor materials in configuring a plurality of thin film transistors constituting a driving circuit for a unit pixel.

BACKGROUND

An organic light emitting display (OLED) that emits light by itself substituting a liquid crystal display (LCD) for a display device used in computer monitors, TVs, mobile phones, laptops, smart watches, vehicle dashboards, and the like is being actively researched.

Display devices are diversely applicable, and a display device having a reduced volume and weight according to products while being usable in various areas ranging from small electronic products to super-large billboards is required.

Since the organic light emitting display capable of implementing a relatively thin and light display device includes a light emitting element formed on a flexible substrate, the organic light emitting display is capable of configuring a screen in various forms such as the screen being bent, folded, or rolled.

In addition, in order to be applied to display devices such as smart watches or menu boards with many still screens, a light emitting display device having a new type of driving circuit capable of reducing power consumption by preventing leakage current in still screens is required.

In configuring such a driving circuit, a method of using a thin film transistor using an oxide semiconductor, which is advantageous for preventing a leakage current, has been proposed.

A display device including thin film transistors using different types of semiconductor layers, for example, a polycrystalline silicon semiconductor layer and an oxide semiconductor layer may be fabricated through a complicated process in which a process of forming the polycrystalline silicon semiconductor layer and a process of forming the oxide semiconductor layer needs be performed separately. In addition, since the polycrystalline silicon semiconductor layer and the oxide semiconductor layer have different characteristics even for the same chemical gas, a more complicated process is required.

Since the polycrystalline silicon semiconductor layer has a faster movement speed of carriers such as electrons and holes than the oxide semiconductor layer, the polycrystalline silicon semiconductor layer is suitable for driving thin film transistors that require fast driving. Therefore, a driving thin film transistor is generally implemented using a polycrystalline silicon semiconductor layer.

However, the driving thin film transistor using the polycrystalline silicon semiconductor layer has a fast-driving speed, but has a problem of being disadvantageous in expressing low gray scales because of a large fluctuation rate in current due to current stress.

SUMMARY

Accordingly, an object of the present disclosure is to provide a driving element capable of reducing a current fluctuation rate due to current stress and having a large S-factor value indicating a charging speed of a voltage provided to a pixel electrode by implementing a driving thin film transistor using an oxide semiconductor.

In addition, an object of the present disclosure is to provide a driving thin film transistor using an oxide semiconductor capable of having a high threshold voltage and optical reliability for stable driving for a long time.

The objects to be achieved in the present disclosure are not limited to the objects mentioned above, and other objects not mentioned can be clearly understood by those of ordinary skill in the art to which the inventive concept belongs from the description below.

According to an embodiment, an organic light emitting display device includes a light emitting element, a driving transistor configured to provide a driving current to the light emitting element and including a first oxide semiconductor layer and a first gate electrode disposed on the first oxide semiconductor layer, a first light blocking layer overlapping the first oxide semiconductor layer under the first oxide semiconductor layer, and at least one insulating layer disposed between the first light blocking layer and the first gate electrode and made of a hydrogen-free silicon nitride material. Accordingly, it is possible to increase the S-factor of the driving transistor employing the oxide semiconductor layer and secure performance.

Other embodiment specifics are included in the detailed description and drawings.

BRIEF DESCRIPTION OF THE DRAWINGS

FIG. 7 is a cross-sectional view of a display device according to another embodiment of the present disclosure.

DETAILED DESCRIPTION

Figure 1:
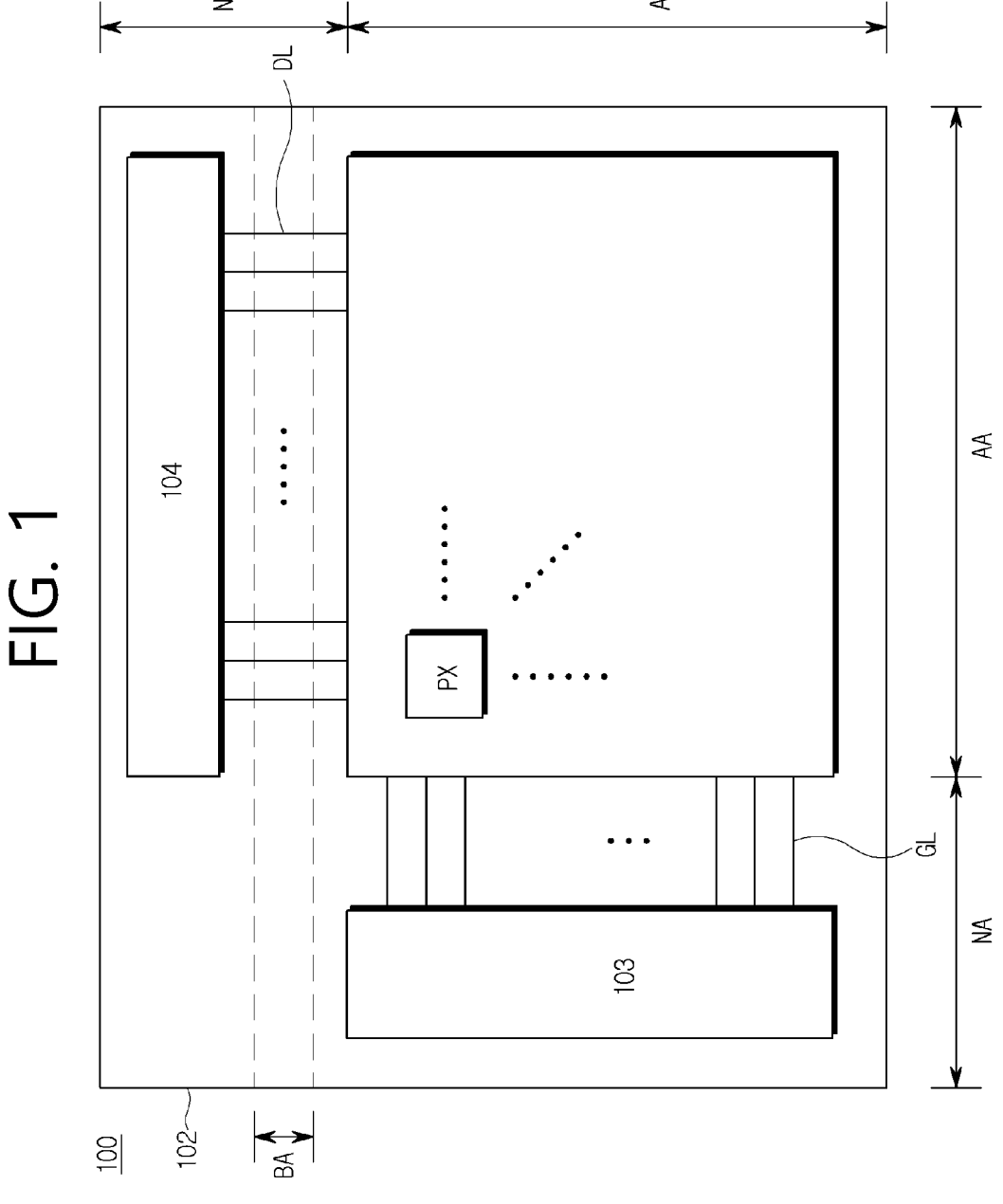
FIG. 1 is a block diagram illustrating a display device according to an embodiment of the present disclosure.

Advantages and features of the present disclosure, and a method of achieving them will become apparent with reference to the embodiments described below in detail in conjunction with the accompanying drawings. However, the present disclosure is not limited to the embodiment to be disclosed below and is implemented in different and various forms. The embodiments bring about the complete disclosure of the present disclosure and are only provided to make those skilled in the art fully understand the scope of the present disclosure. The present disclosure is just defined by the scope of the appended claims.

The shapes, areas, ratios, angles, numbers, and the like illustrated in the accompanying drawings for describing various embodiments of the present disclosure are merely examples, and the present disclosure is not limited thereto. Like reference numerals refer to like elements throughout. Further, in the following description of the present disclosure, a detailed description of known related technologies may be omitted to avoid unnecessarily obscuring the subject matter of the present disclosure. The terms such as "including," "having," and "comprising" used herein are generally intended to allow other elements to be added unless the terms are used with the term "only". Any references to singular may include plural unless expressly stated otherwise.

Elements are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

It will be understood that when an element is referred to as being "on" another element or layer, it may be directly on the other element or layer, or intervening elements may also be present.

While terms such as the first and the second, etc., can be used to describe various components, the components are not limited by the terms mentioned above. The terms are used only for distinguishing between one component and other components. Therefore, the first component to be described below may be the second component within the spirit of the present disclosure.

Same reference numerals refer to same elements throughout.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, a source electrode in one embodiment may be a drain electrode in another embodiment, and a drain electrode in one embodiment may be a source electrode in another embodiment.

In one or more aspects of the present disclosure, for convenience of explanation, a source region is distinguished from a source electrode, and a drain region is distinguished from a drain electrode. However, aspects of the present disclosure are not limited to this structure. For example, the source region may be the source electrode, and the drain region may be the drain electrode. Also, the source region may be the drain electrode, and the drain region may be the source electrode.

A size and thickness of each configuration illustrated in the drawings are illustrated for convenience of description, and the present disclosure is not essentially limited to the size and the thickness of the illustrated configuration.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the present disclosure will be described with reference to the drawings.

FIG. 1 is a block diagram illustrating a display device 100 according to an embodiment of the present disclosure.

Referring to FIG. 1, a display device 100 according to an embodiment of the present disclosure may include a display panel 102, a printed circuit board including driving circuits that transmit a voltage and a signal to the display panel 102, and instruments equipped with the display panel 102. The display panel 102 may include a display area AA and a non-display area NA that is a peripheral area of the display area AA.

The display panel 102 may include a substrate made of a plastic material having flexibility so as to be bendable. For example, the substrate may be made of a material such as polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer. Also, very thin glass may be used to bend the display panel 102.

A plurality of sub-pixels for realizing a screen may be disposed in the display area AA. The sub-pixel PX may include a light emitting element and a pixel driving circuit for applying a driving current to the light emitting element. Further, the pixel driving circuit may be implemented with thin film transistors using an oxide semiconductor material as an active layer.

At least one of a data driver 104 and a gate driver 103 may be disposed in the non-display area NA. In addition, the non-display area NA may further include a bending area BA where the display panel 102 is bent.

The gate driver 103 may be directly formed on a substrate as a P-channel metal oxide semiconductor (PMOS) circuit implemented with thin film transistors using a polycrystalline semiconductor material as an active layer, or may be directly formed on a substrate as a Complementary metal oxide semiconductor (CMOS) circuit implemented using thin film transistors using a polycrystalline semiconductor material as an active layer and a thin film transistor using an oxide semiconductor material as an active layer. When the same semiconductor material is used for thin film transistors disposed in the non-display area NA and the display area AA, the same processes may be performed simultaneously.

The thin film transistor having an oxide semiconductor layer and the thin film transistor having a polycrystalline silicon semiconductor layer may have high electron mobility in a channel, thus implementing high resolution and low power consumption.

A plurality of data lines and a plurality of gate lines may be disposed in the display area AA. For example, the plurality of data lines may be arranged in columns, and the plurality of gate lines may be arranged in rows. The data line and the gate line may be individually connected to a driving circuit included in the sub-pixel PX.

The gate driver 103 including a gate driving circuit may be disposed in the non-display area NA. The gate driving circuit of the gate driver 103 may sequentially drive pixel rows in the display area AA by sequentially supplying a scan signal and an emission signal to the plurality of gate lines GL. The gate driving circuit may include a scan driving circuit providing a scan signal and an emission driving circuit providing an emission signal. In this case, the pixel row may refer to a row including pixels connected to one gate line GL.

The gate driving circuit may include a shift register, a level shifter, and the like.

Like the display device 100 according to the embodiment of the present disclosure, the gate driving circuit may be implemented in a Gate In Panel (GIP) type and directly disposed on the substrate.

The gate driver 103 may sequentially supply a scan signal and an emission signal with an On voltage or an Off voltage to a plurality of gate lines.

The data driver 104 included in the display device 100 according to an embodiment of the present disclosure may convert image data into an analog data voltage and supply the analog data voltage to a plurality of data lines when an on-voltage is provided to a specified gate line by the gate driver 103.

The plurality of gate lines GL disposed on the substrate may include a plurality of scan lines and a plurality of emission lines. The plurality of scan lines each may transfer a scan signal to the gate node of a scan transistor, and the plurality of emission lines each may transfer an emission signal to the gate node of an emission transistor.

The data line DL may be disposed to pass through a bending area BA while being connected between the sub-pixel PX and the data driver 104. Specifically, the data line DL may be connected to a data pad connected to the data driver 104.

The bending area BA is an area where the substrate is bent and deformed. The substrate may be maintained in a flat state except for the bending area BA. A portion of the non-display area NA may overlap the rear surface of the display area AA through the bending area BA.

Figure 2:
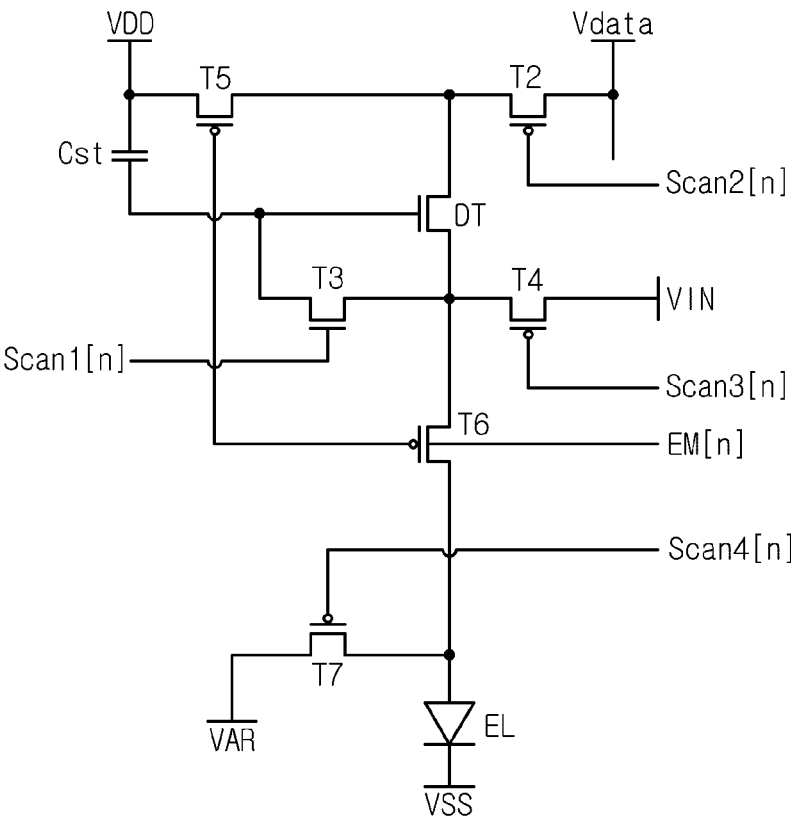
FIG. 2 is a circuit diagram illustrating a pixel driving circuit included in a display device according to an embodiment of the present disclosure.

FIG. 2 is a circuit diagram illustrating a pixel driving circuit included in the display device 100 according to an embodiment of the present disclosure.

The display device 100 according to an embodiment of the present disclosure may include a pixel driving circuit including seven thin film transistors and one storage capacitor Cst. One of the seven thin film transistors may be the driving thin film transistor DT, and the rest of the seven thin film transistors may be switching thin film transistors T2, T3, T4, T5, T6, and 17 for compensating for deterioration of the driving thin film transistor DT or a light emitting element EL and driving the driving thin film transistor DT. The pixel driving circuit may apply a driving current to the light emitting element EL. The light emitting element EL may be an organic light emitting element or an inorganic light emitting element. For example, the light emitting element EL may be an element using an organic light emitting diode, a Micro LED (Micro light emitting diode), an LED, a Quantum Dot, or the like as a material.

As an embodiment of the present disclosure, the pixel driving circuit is implemented to be connected to the anode electrode of the light emitting element EL to apply a driving current to the anode electrode, but is not limited thereto. The pixel driving circuit may be implemented to be connected to the cathode electrode of the light emitting element EL.

In the pixel driving circuit according to an embodiment of the present disclosure, the active layer of the driving thin film transistor DT and the active layer of a third switching thin film transistor T3 connected to one of a gate electrode, a source electrode, and a drain electrode constituting the driving thin film transistor DT are formed using an oxide semiconductor material. In addition, at least one of the remaining switching thin film transistors T2, T4, T5, T6, and T7 for compensating the driving thin film transistor DT may use a polycrystalline semiconductor material as an active layer.

The switching thin film transistors to be described below may be briefly referred to as switching transistors or transistors, and the driving thin film transistors to be described below may also be referred to as driving transistors.

Gate lines GL disposed in the n-th pixel row included in the display device 100 according to an embodiment of the present disclosure may include a first scan signal Scan1[n], a second scan signal Scan2 [n], a third scan signal Scan3[n], a fourth scan signal Scan4[n], and an emission signal EM[n]. In this case, the fourth scan signal Scan4[n] may be connected to the third scan signal disposed in the (n+1)-th pixel row.

The first scan signal Scan1[n] may control turn-on and turn-off of the third transistor T3, and the second scan signal Scan2[n] may control the turn-on and turn-off of the second transistor T2. The third scan signal Scan3[n] may control turn-on and turn-off of the fourth transistor T4, and the fourth scan signal Scan4[n] may control the turn-on and turn-off of the seventh transistor T7. The emission signal Em[n] may control the turn-on and turn-off of the fifth transistor T5 and the sixth transistor T6.

Data lines DL and power lines may be disposed in the pixel driving circuit in addition to the gate line GL. The data line DL may be connected to the second transistor T2 to provide a data voltage Vdata to the drain electrode of the driving thin film transistor DT. The power lines may include an initialization line for providing an initialization voltage VIN, a high potential line for providing a high potential voltage VDD, a low potential line for providing a low potential voltage VSS, and an anode reset voltage line for providing an anode reset voltage VAR.

The initialization voltage VIN may be provided to the source electrode of the driving thin film transistor DT through the fourth transistor T4, and the high potential voltage VDD may be provided to the drain electrode of the driving thin film transistor DT via one electrode of the capacitor Cst or the fifth transistor T5. The low potential voltage VSS may be provided to the cathode electrode of the light emitting element EL and the anode reset voltage VAR may be provided to the anode electrode of the light emitting element through the seventh transistor T7.

The present disclosure is not limited to the pixel driving circuit of FIG. 2 and may be applied to internal compensation circuits or external compensation circuits of various configurations.

Figure 3:
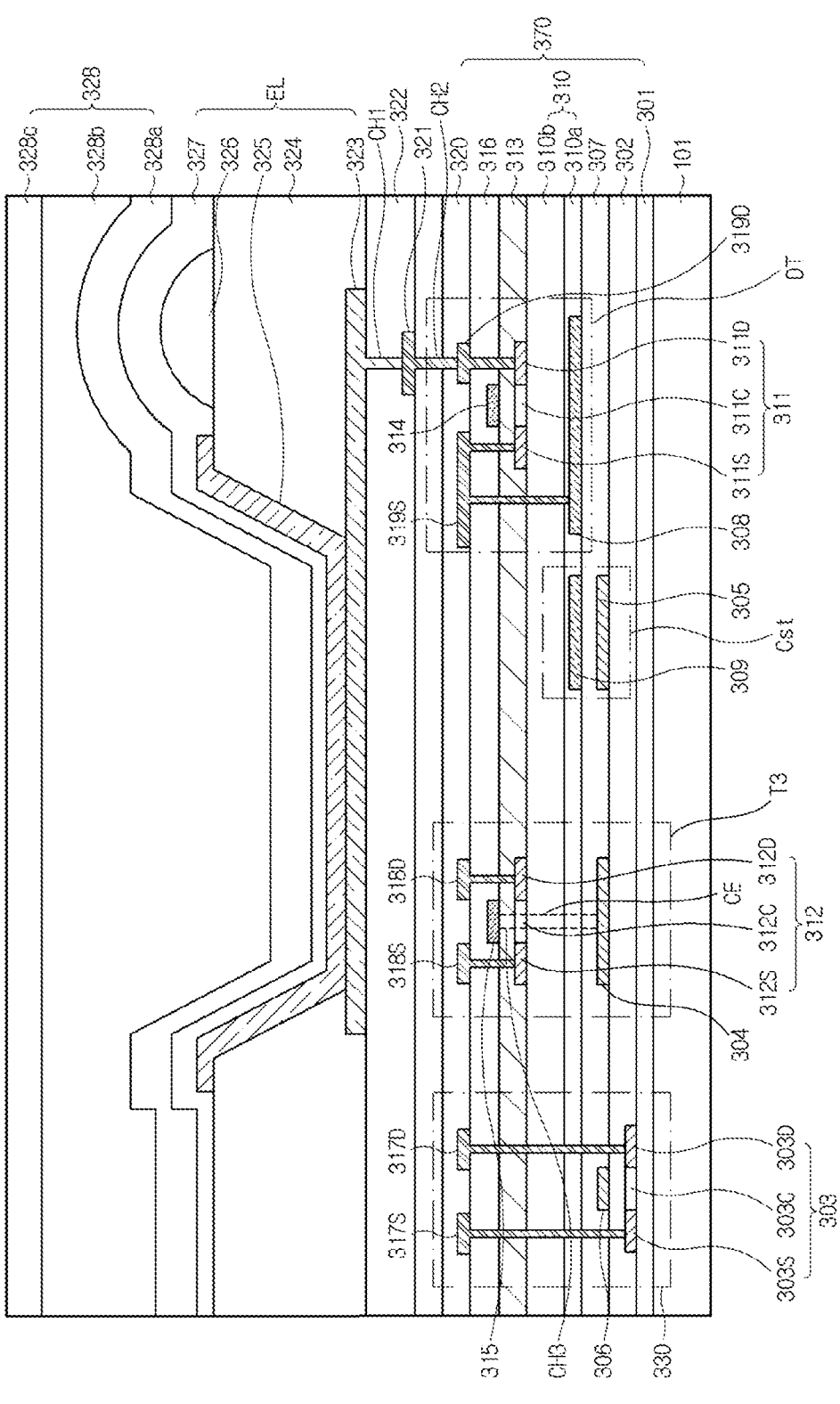
FIG. 3 is a cross-sectional view of a display device according to an embodiment of the present disclosure.

FIG. 3 is a cross-sectional view of the display device 100 according to an embodiment of the present disclosure.

FIG. 3 shows a cross-sectional view of the display device 100 including one driving thin film transistor DT, two switching thin film transistors T3 and 330, and one capacitor Cst. The two switching thin film transistors T3 and 330 may include the third switching thin film transistor T3 including an oxide semiconductor material and one switching thin film transistor 330 of the switching thin film transistors T2, T4, T5, T6 and T7 including a polycrystalline semiconductor material. In this case, the third switching thin film transistor T3 may be referred to as an oxide switching thin film transistor T3, and the switching thin film transistors including a polycrystalline semiconductor material may be referred to as the polycrystalline switching thin film transistor 330.

As described above, one sub-pixel PX may include a light emitting element EL and a pixel driving circuit 370 that applies a driving current to the light emitting element EL. The pixel driving circuit 370 may be disposed on the substrate 101, and the light emitting element EL may be disposed on the pixel driving circuit 370. An encapsulation layer 328 may be disposed on the light emitting element EL to protect the light emitting element EL.

The pixel driving circuit 370 may refer to an array unit of one sub-pixel PX including the driving thin film transistor DT, the switching thin film transistors T3 and 330, and the capacitor Cst. Also, the light emitting element EL may refer to an array unit for emitting light, the array unit including an anode electrode, a cathode electrode, and a light emitting layer disposed therebetween.

In one embodiment of the present disclosure, the driving thin film transistor DT and at least one switching thin film transistor may use an oxide semiconductor as an active layer. The thin film transistor using an oxide semiconductor material as an active layer may have an excellent leakage current blocking effect and relatively inexpensive manufacturing cost, compared to a thin film transistor using a polycrystalline semiconductor material as an active layer. Therefore, in order to reduce power consumption and manufacturing cost, the pixel driving circuit 370 according to an embodiment of the present disclosure may include a driving thin film transistor DT using an oxide semiconductor material and at least one switching thin film transistor.

All of the thin film transistors constituting the pixel driving circuit 370 may be implemented using an oxide semiconductor material, or only some of the switching thin film transistors may be implemented using an oxide semiconductor material.

It should be noted that the one embodiment of the present disclosure includes both a switching thin film transistor using an oxide semiconductor material and a switching thin film transistor using a polycrystalline semiconductor material because a thin film transistor using an oxide semiconductor material is difficult to secure reliability and a thin film transistor using a polycrystalline semiconductor material has a high operating speed and excellent reliability.

The substrate 101 may be implemented as a multi-layer in which an organic film and an inorganic film are alternately stacked. For example, the substrate 101 may be formed by alternately stacking organic films such as polyimide and inorganic films such as silicon oxide ($SiO_2$).

A lower buffer layer 301 may be formed on the substrate 101. The lower buffer layer 301 is to prevent moisture from permeating from the outside, and may be used by stacking a silicon oxide ($SiO_2$) film or the like in multiple layers.

An auxiliary buffer layer may be further disposed on the lower buffer layer 301 to protect the element from moisture permeation.

A polycrystalline switching thin film transistor 330 may be formed on the substrate 101. The polycrystalline switching thin film transistor 330 may use a polycrystalline semiconductor as an active layer. The polycrystalline switching thin film transistor 330 may include a first active layer 303 including a channel through which electrons or holes move, a first gate electrode 306, a first source electrode 317S, and a first drain electrode 317D.

The first active layer 303 may include a first channel region 303C, a first source region 303S disposed on one side, and a first drain region 303D disposed on the other side with the first channel region 303C interposed therebetween.

The first source area 303S and the first drain area 303D may be formed by doping an intrinsic polycrystalline semiconductor material with dopant ions of Group V or Group III, for example, phosphorus (P) or boron (B) at a predetermined concentration.

The first channel area 303C, in which a polycrystalline semiconductor material is maintained in an intrinsic state, may provide a path through which electrons or holes move.

Meanwhile, the polycrystalline switching thin film transistor 330 may include a first gate electrode 306 overlapping the first channel region 303C of the first active layer 303. A first gate insulating layer 302 may be disposed between the first gate electrode 306 and the first active layer 303.

The first gate insulating layer 302 may be formed by stacking a silicon oxide ($SiO_2$) film or the like in a single layer or multiple layers. Since the thin film transistors using polycrystalline semiconductors are relatively less affected by hydrogen than thin film transistors using oxide semiconductors but a defect such as shifting of a threshold voltage is likely to occur when hydrogen atoms are excessively generated, silicon oxide ($SiO_2$) containing a relatively small amount of hydrogen may be used as a gate insulating layer.

In one embodiment of the present disclosure, the polycrystalline switching thin film transistor 330 may have a top gate structure in which the first gate electrode 306 is positioned above the first active layer 303. Accordingly, the first electrode 305 included in the capacitor Cst and the second light blocking layer 304 included in the oxide switching thin film transistor T3 may be formed of the same material as the first gate electrode 306 and may be disposed in the same layer. It is possible to reduce the number of mask processes by forming the first gate electrode 306, the first electrode 305, and the second light blocking layer 304 through one mask process.

The first gate electrode 306 may be made of a metal material. For example, the first gate electrode 306 may be a single layer or a multi-layer made of at least one of molybdenum (Mo), aluminum (Al), chromium (Cr), gold (Au), titanium (Ti), nickel (Ni), neodymium (Nd), and copper (Cu) and an alloy thereof, but is not limited thereto.

A first interlayer insulating layer 307 may be disposed on the first gate electrode 306. The first interlayer insulating layer 307 may be implemented with silicon nitride (SiNx). In particular, the first interlayer insulating layer 307 made of silicon nitride (SiNx) may include hydrogen atoms (hydrogen particles). When the first active layer 303, the first gate insulating layer 302, and the first gate electrode 306 are formed, the first interlayer insulating layer 307 is deposited thereon, and then the heat treatment process is performed, hydrogen atoms contained in the first interlayer insulating layer 307 may penetrate into the first source region 303S and the first drain region 303D to contribute to improving and stabilizing the conductivity of the polycrystalline semiconductor material. The above process may be also called a hydrogenation process.

The polycrystalline switching thin film transistor 330 may further include an upper buffer layer 310, a second gate insulating layer 313, and a second interlayer insulating layer 316 sequentially disposed on the first interlayer insulating layer 307, and may include a first source electrode 317S and a first drain electrode 317D formed on the second interlayer insulating layer 316 and connected to the first source region 303S and the first drain region 303D, respectively.

The first source electrode 317S and the first drain electrode 317D may be a single layer or a multi-layer made of at least one of molybdenum (Mo), aluminum (Al), chromium (Cr), gold (Au), titanium (Ti), nickel (Ni), neodymium (Nd), and copper (Cu) and an alloy thereof, but are not limited thereto.

The upper buffer layer 310 may space the second active layer 312 of the oxide switching thin film transistor T3 made of an oxide semiconductor material and the third active layer 311 of the driving thin film transistor DT from the first active layer 303 implemented with a crystalline semiconductor material and provide a basis on which the second active layer 312 and the third active layer 311 are to be formed.

The second interlayer insulating layer 316 may cover the second gate electrode 315 of the oxide switching thin film transistor T3 and the third gate electrode 314 of the driving thin film transistor DT. The second gate electrode 315 and the third gate electrode 314 may be disposed in the same layer and made of the same material. Since the second interlayer insulating layer 316 is formed on the second active layer 312 and the third active layer 311 which are made of an oxide semiconductor material, the second interlayer insulating layer 316 may be implemented as an inorganic film. For example, the second interlayer insulating layer 316 may be formed of silicon oxide ($SiO_2$).

The second gate electrode 315 may be made of a metal material. For example, the second gate electrode 315 may be a single layer or a multi-layer made of at least one of molybdenum (Mo), aluminum (Al), chromium (Cr), gold (Au), titanium (Ti), nickel (Ni), neodymium (Nd), and copper (Cu) and an alloy thereof, but is not limited thereto.

Meanwhile, the oxide switching thin film transistor T3 may include the second active layer 312 formed on the upper buffer layer 310 and made of an oxide semiconductor material, the second gate insulating layer 313 covering the second active layer 312, the second gate electrode 315 disposed on the second gate insulating layer 313, the second interlayer insulating layer 316 covering the second gate electrode 315, and the second source electrode 318S and the second drain electrode 318D disposed on the second interlayer insulating layer 316.

The second active layer 312 may include an intrinsic second channel region 312C made of an oxide semiconductor material and undoped with dopant, and a second source region 312S and a second drain region 312D, which are doped with dopant to have conductivity.

The oxide switching thin film transistor T3 may further include a second light blocking layer 304 positioned under the upper buffer layer 310 and overlapping the second active layer 312. The second light blocking layer 304 may be made of the same material as the first gate electrode 306 and may be formed on an upper surface of the first gate insulating layer 302.

The second light blocking layer 304 may be electrically connected to the second gate electrode 315 to form a dual gate. A connection electrode CE may be separately included to electrically connect the second light blocking layer 304 and the second gate electrode 315, and the connection electrode CE may be formed in such a way that a contact hole is formed in the first interlayer insulating layer 307, the upper buffer layer 310, and the second gate insulating layer 313 by bypassing the second active layer 312. Accordingly, the oxide switching thin film transistor T3 may be implemented to have a dual gate structure to more precisely control the flow of current flowing through the second channel layer 312C and enable manufacturing in a smaller size, thereby realizing a high-resolution display device.

The second source electrode 318S and the second drain electrode 318D may be simultaneously formed with the same material on the second interlayer insulating layer 316 together with the first source electrode 317S and the first drain electrode 317D, thus reducing the number of processes.

Meanwhile, the driving thin film transistor DT may be formed on the upper buffer layer 310.

The driving thin film transistor DT according to an embodiment of the present disclosure may include a third active layer 311 made of an oxide semiconductor material.

The driving thin film transistor using a polycrystalline semiconductor material advantageous for high-speed operation as an active layer may consume large power due to a leakage current in an off state. Therefore, the driving thin film transistor DT according to an embodiment of the present disclosure may use an oxide semiconductor material, which is advantageous for preventing occurrence of a leakage current, as an active layer.

In the case of a thin film transistor using an oxide semiconductor material as an active layer, a defect may occur in a low grayscale region in which precise current control is required because a variation value in current for a unit variation value in voltage is large due to the nature of the material of the oxide semiconductor. Accordingly, an embodiment of the present disclosure provides a driving thin film transistor in which a variation value in current in an active layer is relatively small with respect to a variation value in voltage applied to the gate electrode.

Referring to FIG. 3, the driving thin film transistor DT may include the third active layer 311 formed on the upper buffer layer 310 and made of an oxide semiconductor material, the second gate insulating layer 313 covering the third active layer 311, the third gate electrode 314 formed on the second gate insulating layer 313 and overlapping the third active layer 311, the second interlayer insulating layer 316 covering the third gate electrode 314, and the third source electrode 319S and the third drain electrode 319D disposed on the second interlayer insulating layer 316.

The driving thin film transistor DT may further include a first light blocking layer 308 disposed inside the upper buffer layer 310 and overlapping the third active layer 311. The first light blocking layer 308 may be inserted into the upper buffer layer 310. To describe in more detail how to dispose the first light blocking layer 308 inside the upper buffer layer 310, the upper buffer layer 310 may include a first upper buffer layer 310a and a second upper buffer layer 310b. The first light blocking layer 308 may be disposed on the first interlayer insulating layer 307, and the first upper buffer layer 310a may cover the first light blocking layer 308. In addition, the second upper buffer layer 310b may be disposed on the first upper buffer layer 310a.

In the display panel 102 according to an embodiment of the present disclosure, the first upper buffer layer 310a and the second upper buffer layer 310b may be made of silicon oxide ($SiO_2$) Alternatively, the first upper buffer layer 310a may be made of silicon nitride (SiNx) and the second upper buffer layer 310b may be made of silicon oxide ($SiO_2$) In the process of forming a thin film, a small amount of hydrogen may be caused from silicon oxide ($SiO_2$), compared to silicon nitride (SiNx).

Therefore, the second upper buffer layer 310b, which is close to the second active layer 312 and the third active layer 311, is made of silicon oxide ($SiO_2$), thereby reducing influence on the oxide switching thin film transistor T3 and the driving thin film transistor DT which use, as the active layer, an oxide semiconductor layer whose reliability is likely to be damaged by hydrogen atoms.

On the other hand, since the first upper buffer layer 310a does not directly contact the second active layer 312 and the third active layer 311, the first upper buffer layer 310a may be made of silicon nitride (SiNx) having an excellent ability to trap hydrogen atoms. The first upper buffer layer 310a may cover both the top and side surfaces of the first light blocking layer 308. Since silicon nitride (SiNx) has the excellent ability to trap hydrogen atoms compared to silicon oxide ($SiO_2$), it is possible to capture hydrogen atoms that may be generated under the first upper buffer layer 310a by forming the first upper buffer layer 310a with silicon nitride (SiNx) to reduce an influence on the oxide switching thin film transistor T3 and the driving thin film transistor DT using the oxide semiconductor layer as an active layer.

The first interlayer insulating layer 307 disposed under the upper buffer layer 310 may include hydrogen atoms. Hydrogen atoms generated during a hydrogenation process for the polycrystalline switching thin film transistor 330 using a polycrystalline semiconductor material as an active layer may pass through the upper buffer layer 310 to damage the reliability of the oxide semiconductor layer positioned on the upper buffer layer 310. That is, when hydrogen atoms penetrate into the oxide semiconductor layer, thin film transistors using the oxide semiconductor layer as an active layer may have different threshold voltages or a varying channel conductivity depending on where the transistors are formed. Since the driving thin film transistor DT directly contributes to the operation of the light emitting element EL, it is important to secure reliability.

Meanwhile, in the display device according to an embodiment of the present disclosure, the second gate insulating layer 313 may be made of hydrogen-free silicon nitride (SiN:xF). Since the second gate insulating layer 313 is disposed between the second active layer 312 and the second gate electrode 315 and between the third active layer 311 and the third gate electrode 314, the dielectric constant of the second gate insulating layer 313 may affect the characteristics of the driving thin film transistor DT.

In general, since the dielectric constant of silicon nitride (SiNx) is 7.5 [ε] and the dielectric constant of silicon oxide (SiO$_2$) is 3.9 [ε], the margin for an increase in the thickness of the second gate insulating layer 313 may be increased when the second gate insulating layer 313 is made of silicon nitride (SiNx). That is, it may be unnecessary to increase the thickness of the second gate insulating layer 313.

However, hydrogen is usually generated when silicon nitride (SiNx) is formed. Since the second gate insulating layer 313 is disposed to be in contact with the second active layer 312 and the third active layer 311, hydrogen atoms generated when the second gate insulating layer 313 is formed may affect the active layer. Accordingly, the second gate insulating layer 313 made of hydrogen-free silicon nitride (SiNx:F) may be deposited according to the following method.

$$SiF4+N2 \rightarrow SiNx \qquad \text{[Scheme I]}$$

According to Scheme 1, when dinitrogen (N2) is used as a reaction gas for silicon tetrafluoride (SiF4), silicon nitride (SiNx) may be formed. In this case, since no hydrogen is generated in the process of forming silicon nitride (SiNx), the active layer made of the oxide semiconductor may not be affected.

For example, when silicon oxide (SiO$_2$) is used as the second gate insulating layer 313, the thickness of the second gate insulating layer 313 may be necessarily increased to improve the s-factor of the driving thin film transistor DT. Since an increase in the thickness of the second gate insulating layer 313 increases a distance between the second active layer 312 and the second gate electrode 315 in the oxide switching thin film transistor T3, a decrease in the majority carrier of the second channel region 312C of the oxide switching thin film transistor T3 is caused, thus reducing device performance of the oxide switching thin film transistor T3.

Therefore, in the display device according to an embodiment of the present disclosure, it is possible to improve the dielectric constant of the second gate insulating layer 313 and secure a sufficient number of carriers in the channel region by using hydrogen-free silicon nitride (SiNx:F) as the second gate insulating layer 313. Accordingly, the performance of the switching thin film transistor T3 may be improved.

Meanwhile, the first light blocking layer 308 may be disposed vertically below the third active layer 311 so as to overlap the third active layer 311. Also, the first light blocking layer 308 may be formed larger in size than the third active layer 311 so as to completely overlap the third active layer 311.

The first light blocking layer 308 may be made of the same material as the second electrode 309 on the first interlayer insulating layer 307 and may be disposed in the same layer as the second electrode 309. The second electrode 309 may be disposed to overlap the first electrode 305 to form a capacitor Cst.

The first light blocking layer 308 and the second electrode 309 may be a single layer or a multi-layer made of at least one of molybdenum (Mo), aluminum (Al), chromium (Cr), gold (Au), titanium (Ti), nickel (Ni), neodymium (Nd), and copper (Cu) and an alloy thereof.

The capacitor Cst may store a data voltage Vdata applied through the data line DL for a certain period of time and provide the data voltage to the light emitting element EL.

The capacitor Cst may include two electrodes corresponding to each other and a dielectric disposed between the two electrodes. The first interlayer insulating layer 307 may be positioned between the first electrode 305 and the second electrode 309.

The first electrode 305 of the capacitor Cst may be electrically connected to the third gate electrode 314 of the driving thin film transistor DT. However, the connection relationship of the capacitor Cst may be changed according to a pixel driving circuit without being limited thereto.

The third active layer 311 may be made of an oxide semiconductor material and include an intrinsic third channel region 311C undoped with dopant, and a third source region 311S and a third drain region 311D which are doped with dopant and have conductivity. The third source region 311S and the third drain region 311D may be connected to the third source electrode 319S and the third drain electrode 319D, respectively.

Like the first source electrode 317S and the first drain electrode 317D, the third source electrode 319S and the third drain electrode 319D are a single layer or a multi-layer made of at least one of molybdenum (Mo), aluminum (Al), chromium (Cr), gold (Au), titanium (Ti), or nickel. (Ni), neodymium (Nd), and copper (Cu) and an alloy thereof.

The third source electrode 319S of the driving thin film transistor DT may be electrically connected to the first light blocking layer 308. An additional effect may be obtained by disposing the first light blocking layer 308 inside the upper buffer layer 310 and electrically connecting the third source electrode 319S to the first light blocking layer 308. Details will be described with reference to FIGS. 4 and 5.

Meanwhile, a first planarization layer 320 and a second planarization layer 322 may be sequentially disposed on the pixel driving circuit 370 to planarize an upper end of the pixel driving circuit 370. The first planarization layer 320 and the second planarization layer 322 may be an organic film such as polyimide or acrylic resin.

In addition, a light emitting element EL may be formed on the second planarization layer 322.

The light emitting element EL may include an anode electrode 323, a cathode electrode 327, and a light emitting layer 325 disposed between the anode electrode 323 and the cathode electrode 327. As shown in FIG. 2, in the case of implementation using pixel driving circuits that commonly use a low potential voltage VSS, the anode electrode 323 may be disposed as a separate electrode for each sub-pixel. In the case of implementation using pixel driving circuits that commonly use a high potential voltage VDD, the cathode electrode 327 may be disposed as a separate electrode for each sub-pixel.

The light emitting element EL may be electrically connected to the driving element DT through an intermediate electrode 321 disposed on the first planarization layer 320. Specifically, the anode electrode 323 of the light emitting element EL and the third drain electrode 319D of the driving thin film transistor DT constituting the pixel driving circuit 370 may be connected to each other through the intermediate electrode 321.

The anode electrode 323 may be connected to the intermediate electrode 321 exposed through the first contact hole CH1 passing through the second planarization layer 322. In addition, the intermediate electrode 321 may be connected to the third drain electrode 319D exposed through the second contact hole CH2 passing through the first planarization layer 320.

The intermediate electrode 321 may serve as a medium connecting the third drain electrode 319D and the anode electrode 323. The intermediate electrode 321 may also be made of a conductive material such as copper (Cu), silver (Ag), molybdenum (Mo), or titanium (Ti).

The anode electrode 323 may have a multilayer structure including a transparent conductive film and an opaque conductive film having high reflective efficiency. The transparent conductive film may be made of a material having a relatively high work function value such as indium-tin-oxide (ITO) or indium-zinc-oxide (IZO), and the opaque conductive film may have a single-layer or multi-layer structure including aluminum (Al), silver (Ag), copper (Cu), lead (Pb), molybdenum (Mo), titanium (Ti) or an alloy thereof. For example, the anode electrode 323 may have a structure in which the transparent conductive film, the opaque conductive film, and the transparent conductive film are sequentially stacked, or a structure in which the transparent conductive film and the opaque conductive film are sequentially stacked.

The light emitting layer 325 may be formed by stacking a hole-related layer, an organic light emitting layer, and an electron-related layer on the anode electrode 323 in the order or reverse order thereof.

The bank layer 324 may be a pixel defining film exposing the anode electrode 323 of each sub-pixel PX. The bank layer 324 may be made of an opaque material (e.g., black material) to prevent optical interference between adjacent sub-pixels PX. In this case, the bank layer 324 may include a light blocking material made of at least one of color pigment, organic black, and carbon. A spacer 326 may be further disposed on the bank layer 324.

The cathode electrode 327 may face the anode electrode 323 with the light emitting layer 325 interposed therebetween and may be formed on the top and side surfaces of the light emitting layer 325. The cathode electrode 327 may be integrally formed over the entire display area AA. When applied to a top emission type organic light emitting display device, the cathode electrode 327 may be made of a transparent conductive layer such as indium-tin-oxide (ITO) or indium-zinc-oxide (IZO).

An encapsulation layer 328 to suppress moisture permeation may be further disposed on the cathode electrode 327. The encapsulation layer 328 may include a first inorganic encapsulation layer 328a, a second organic encapsulation layer 328b, and a third inorganic encapsulation layer 328c sequentially stacked.

The first inorganic encapsulation layer 328a and the third inorganic encapsulation layer 328c of the encapsulation layer 328 may be formed of an inorganic material such as silicon oxide (SiOx). The second organic encapsulation layer 328b of the encapsulation layer 328 may be formed of an organic material such as acrylic resin, epoxy resin, phenolic resin, polyamide resin, and polyimide resin.

Figure 4:
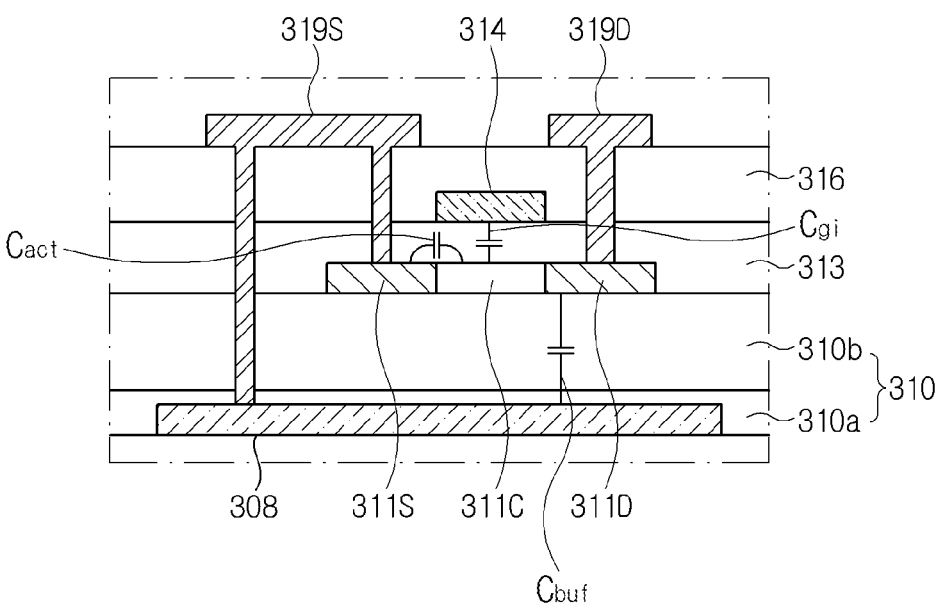
FIG. 4 is a cross-sectional view of a driving thin film transistor according to an embodiment of the present disclosure.
Figure 5:
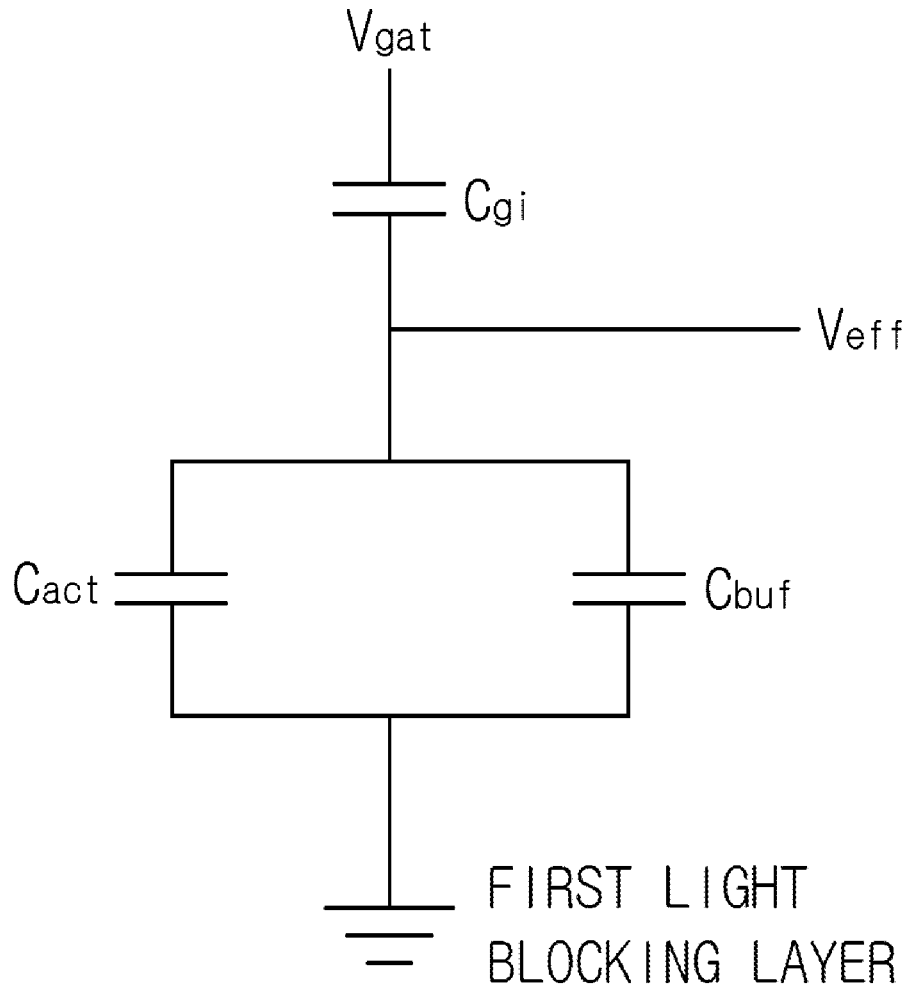
FIG. 5 is a circuit diagram illustrating a relationship between parasitic capacitors formed in a driving thin film transistor according to an embodiment of the present disclosure.
Figure 6:
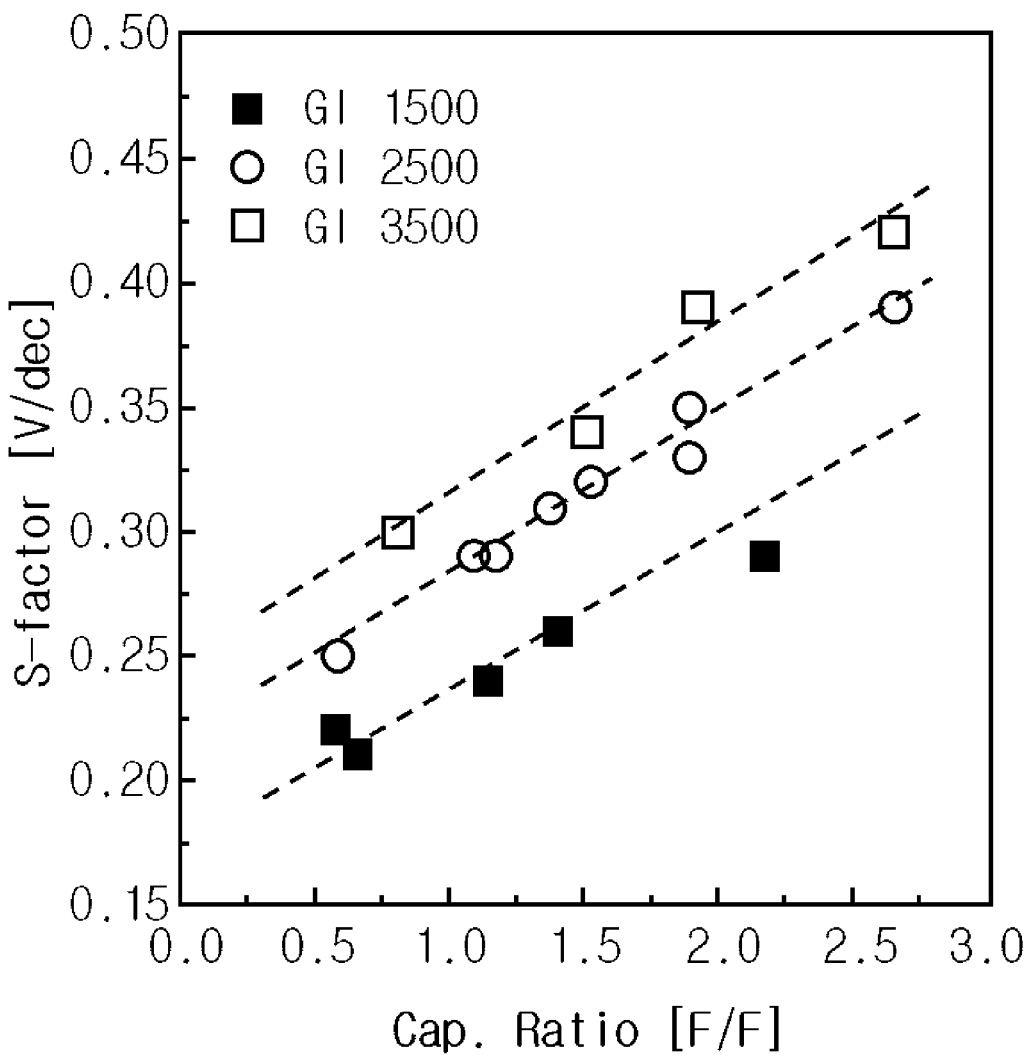
FIG. 6 is a graph showing characteristics of a thin film transistor with respect to an S-factor according to a capacitance ratio.

FIG. 4 is a cross-sectional view of a driving thin film transistor according to an embodiment of the present disclosure. FIG. 5 is a circuit diagram illustrating a relationship between parasitic capacitors formed in a driving thin film transistor according to an embodiment of the present disclosure. Further, FIG. 6 is a graph showing characteristics of a thin film transistor with respect to an S-factor according to a capacitance ratio.

Referring to FIGS. 4 and 5, in the third active layer 311 made of an oxide material, the third source region 311S and the third drain region 311D are doped with dopant to make the third active layer 311 conductive, causing parasitic capacitance inside the third active layer 311, which is referred to as active layer parasitic capacitance Cact. In addition, parasitic capacitance also occurs between the third gate electrode 314 and the third active layer 311, which is referred to as insulating layer parasitic capacitance $C_{gi}$, and parasitic capacitance occurring between the first light blocking layer 308 electrically connected to the third source electrode 319S and a third (auxiliary) active layer 311 is referred to as buffer layer parasitic capacitance $C_{buf}$.

The third active layer 311 and the first light blocking layer 308 are electrically connected through the third source electrode 319S, so that the active layer parasitic capacitance $C_{act}$ and the buffer layer parasitic capacitance $C_{buf}$ are connected in parallel to each other, and the active layer parasitic capacitance $C_{act}$ and the insulating layer parasitic capacitance $C_{gi}$ are connected in series. In addition, when a gate voltage $V_{gat}$ is applied to the third gate electrode 314, an effective voltage Veff applied to the third active layer 311 is obtained by the following formula.

$$\Delta Veff = \frac{C_{gi}}{C_{gi} + C_{act} + C_{buf}} \times \Delta V_{gat}$$

Here, $\Delta$Veff is amount of change in the effective voltage Veff applied to the third active layer 311, $\Delta V_{gat}$ is amount of change in the gate voltage $V_{gat}$ applied to the third gate electrode 314. Since the effective voltage Veff applied to the third channel region 311C of the third active layer 311 is in inverse proportion to the buffer layer parasitic capacitance $C_{buf}$, the effective voltage Veff applied to the third active layer 311 may be controlled by adjusting the buffer layer parasitic capacitance $C_{buf}$.

Therefore, the first light blocking layer 308 is disposed close to the third active layer 311 to increase the buffer layer parasitic capacitance $C_{buf}$, thus reducing an actual current flowing through the third active layer 311.

Reducing the effective current flowing through the third active layer 311 may mean that a control range of the driving thin film transistor DT capable of being controlled through the gate voltage V gat actually applied to the third gate electrode 314 is widened.

In one embodiment of the present disclosure, a distance between the first light blocking layer 308 and the third active layer 311 in the driving thin film transistor DT is implemented to be smaller than a distance between the second light blocking layer 304 and the second active layer 312 in the oxide switching thin film transistor T3, thus widening a range in which the driving thin film transistor DT controls a grayscale. In addition, it is possible to precisely control a light emitting element even in low gray scales, solving the problem of screen stains frequently occurring in low gray scales.

Referring to FIG. 6, S-factor values according to capacitance ratios in an oxide thin film transistor are shown. The capacitance ratios on the horizontal axis of the graph are values of the insulating layer parasitic capacitance $C_{gi}$ with respect to the buffer layer parasitic capacitance $C_{buf}$, in which the insulating layer parasitic capacitance $C_{gi}$ is the numerator and the buffer layer parasitic capacitance $C_{buf}$ is the denominator In addition, the vertical axis of the graph represents the values of the S-factor. In FIG. 6, [V/dec] means V/decade. Measurement conditions are an oxide (IGZTO) thin film transistor, a driving current value of to 1.0 nA, a drain-source voltage value of 5V, and a W/L value of the channel of ⅜ μm.

When the values measured by varying the thickness of the gate insulating layer, such as 1500 Å, 2500 Å, and 3500 Å, are indicated by dotted lines, a rise to the right is shown. That is, as the capacitance ratio increases, the value of the S-factor also increases. In other words, when the value of the gate parasitic capacitance is the same, the value of the S-factor increases as the value of the buffer layer parasitic capacitance increases. In other words, when the thickness of the gate insulating layer is the same, the value of the S-factor increases as the thickness of the upper buffer layer decreases.

The performance of the oxide thin film transistor will be mechanistically described. When the thickness of the upper buffer layer is reduced, the buffer layer parasitic capacitance increases and the effective voltage of the active layer decreases, so that the sensitivity of the gate voltage decreases to increase the S-factor and decrease the on-current, thereby improving the performance of the oxide thin film transistor.

Figure 7:
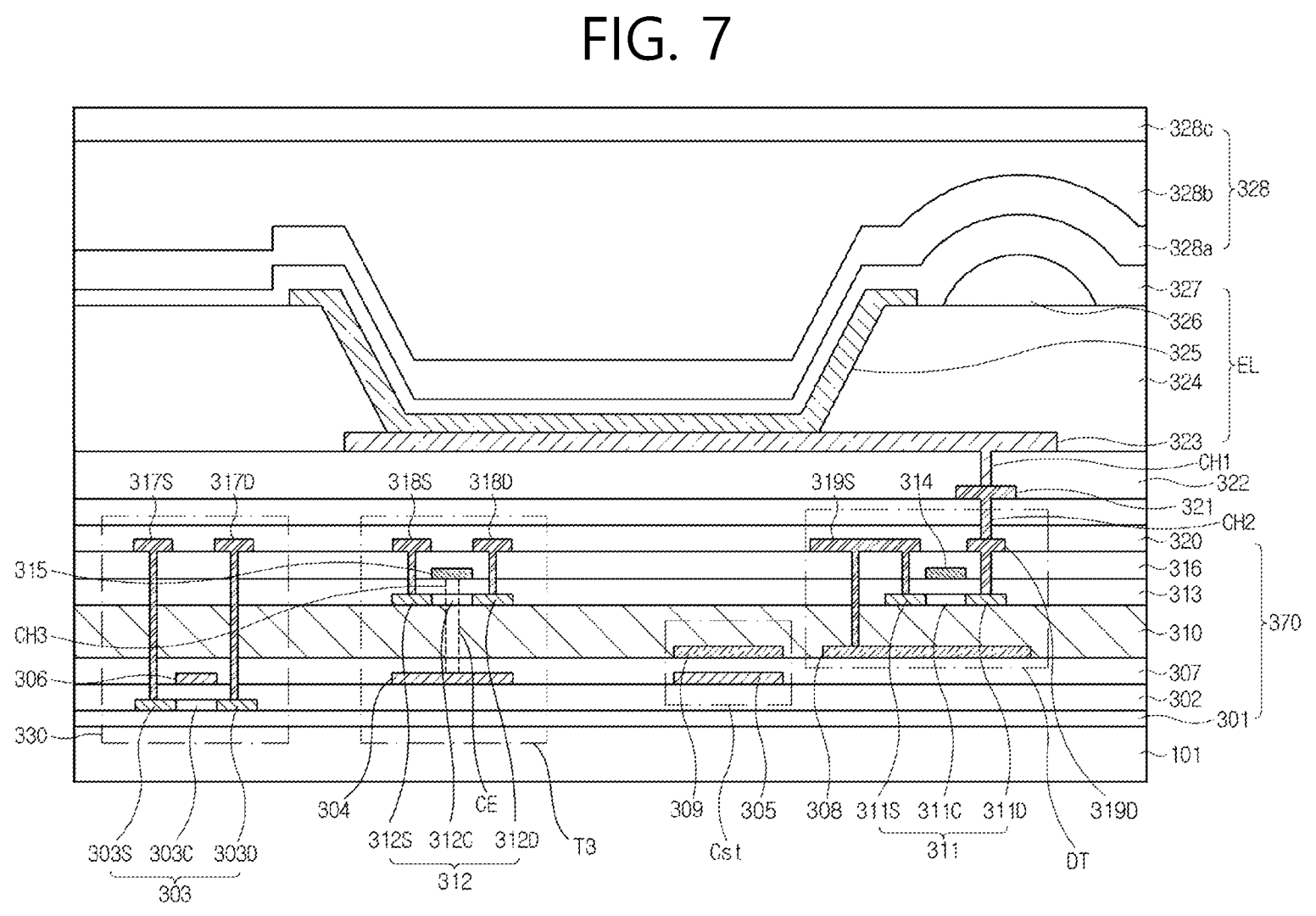

FIG. 7 is a cross-sectional view of a display device according to another embodiment of the present disclosure. FIG. 7 shows an embodiment including the same components as the embodiment of FIG. 3, only except for the structure of the upper buffer layer 310. In FIG. 7, descriptions of components overlapping those of FIG. 3 are omitted or simplified.

Referring to FIG. 7, an upper buffer layer 310' is formed between the first interlayer insulating layer 307 and the second gate insulating layer 313 as a single layer to cover the first light blocking layer 308.

In the display device according to another embodiment of the present disclosure, the second gate insulating layer 313 may be made of silicon oxide (SiO₂) and the upper buffer layer 310' may be made of hydrogen-free silicon nitride (SiNx:F). Since the upper buffer layer 310' contacts the lower surfaces of the second active layer 312 and the third active layer 311, the dielectric constant of the upper buffer layer 310' may affect the characteristics of the driving thin film transistor DT.

When the upper buffer layer 310' is made of hydrogen-free silicon nitride (SiNx:F) having a high dielectric constant, the effective voltage decreases due to the increase in the buffer layer parasitic capacitance Cbuf, thereby removing a necessity to decrease the thickness of the upper buffer layer 310'. For example, when the upper buffer layer 310' is made of hydrogen-free silicon nitride (SiNx:F) having a high dielectric constant, the upper buffer layer 310' may be formed to have the thickness twice that of the upper buffer layer 310' made of silicon oxide (SiO₂). The above-described configuration may prevent a short circuit between the third active layer 311 and the first light blocking layer 308 due to the reduction in thickness of the upper buffer layer 310' in the driving thin film transistor DT, and reliability of the driving thin film transistor DT may be secured due to the high withstand voltage and moisture barrier characteristics of hydrogen-free silicon nitride (SiNx:F). In addition, the S-factor of the driving thin film transistor DT is increased by applying hydrogen-free silicon nitride (SiNx:F) to the upper buffer layer 310, thus improving the performance of the driving thin film transistor DT.

The performance of the driving thin film transistor DT is secured by applying hydrogen-free silicon nitride (SiNx:F) to the upper buffer layer 310, thus removing a necessity to increase the thickness of the second gate insulating layer 313. Accordingly, since the thickness of the second gate insulating layer 313 of the oxide switching thin film transistor T3 is not increased, there is no occurrence of a decrease in the majority carrier of the second channel region 312C of the oxide switching thin film transistor T3. Accordingly, degradation in performance of the oxide switching thin film transistor T3 can be prevented.

A display device according to various embodiments of the present disclosure may be described as follows.

According to an embodiment, an organic light emitting display device includes a light emitting element, a driving transistor configured to provide a driving current to the light emitting element and including a first oxide semiconductor layer and a first gate electrode on disposed the first oxide semiconductor layer, a first light blocking layer overlapping the first oxide semiconductor layer under the first oxide semiconductor layer, and at least one insulating layer disposed between the first light blocking layer and the first gate electrode and made of a hydrogen-free silicon nitride material. Accordingly, it is possible to increase the S-factor of the driving transistor employing the oxide semiconductor layer and secure performance.

According to another feature of the present disclosure, the organic light emitting display device may further include a first switching transistor electrically connected to the driving transistor and including a second oxide semiconductor layer and a second gate electrode disposed on the second oxide semiconductor layer.

According to another feature of the present disclosure, the organic light emitting display device may further include a second light blocking layer overlapping the second oxide semiconductor layer under the second oxide semiconductor layer.

According to another feature of the present disclosure, the insulating layer may be disposed between the second light blocking layer and the second gate electrode.

According to another feature of the present disclosure, a distance between the first light blocking layer and the first oxide semiconductor layer may be smaller than a distance between the second light blocking layer and the second oxide semiconductor layer.

According to another feature of the present disclosure, the organic light emitting display device may further include a second switching transistor electrically connected to the first switching transistor and including a polycrystalline semiconductor layer and a third gate electrode disposed on the polycrystalline semiconductor layer.

According to another feature of the present disclosure, the third gate electrode may be disposed in the same layer and made of the same material as the second light blocking layer.

According to another feature of the present disclosure, the organic light emitting display device may further include at least one silicon nitride layer disposed between the third gate electrode and the first oxide semiconductor layer.

According to another feature of the present disclosure, the silicon nitride layer may be in no contact with the first oxide semiconductor layer.

According to another feature of the present disclosure, the first gate electrode and the second gate electrode may be disposed in the same layer and made of the same material.

According to another feature of the present disclosure, the organic light emitting display device may further include a capacitor including a first electrode disposed in the same layer and made of the same material as the first light blocking layer and a second electrode disposed in the same layer and made of the same material as the second light blocking layer.

According to another feature of the present disclosure, the driving transistor may include a first source electrode and a first drain electrode connected to the first oxide semiconductor layer, and the first source electrode may be connected to the first light blocking layer.

According to another feature of the present disclosure, the insulating layer may be disposed between the first oxide semiconductor layer and the first gate electrode.

According to another feature of the present disclosure, the organic light emitting display device may further include a first buffer layer and a second buffer layer disposed between the first oxide semiconductor layer and the first light blocking layer.

According to another feature of the present disclosure, the first buffer layer may be made of a silicon nitride material, and the second buffer layer may be made of a silicon oxide material.

According to another feature of the present disclosure, the second buffer layer may be disposed on the first buffer layer.

According to another feature of the present disclosure, the insulating layer may be disposed between the first light blocking layer and the first oxide semiconductor layer.

According to another feature of the present disclosure, the organic light emitting display device may further include a silicon oxide layer disposed between the first oxide semiconductor layer and the first gate electrode.

According to the embodiments of the present disclosure, it is possible to reduce leakage current and power consumption when the thin film transistor is turned off by implementing a driving circuit to include a driving thin film transistor and a switching thin film transistor including an oxide semiconductor.

According to the embodiments of the present disclosure, it is possible to reduce an effective voltage generated in an oxide semiconductor through control of a parasitic capacitance and to enable precise grayscale expression in low grayscales by implementing a driving thin film transistor including an oxide semiconductor. Accordingly, defects such as screen stains of the organic light emitting display device may be reduced.

According to the embodiments of the present disclosure, it is possible to increase the number of carriers in the channel region to improve the performance of a switching thin film transistor by disposing a hydrogen-free insulating layer between an oxide semiconductor layer and a gate electrode in the switching thin film transistor using an oxide semiconductor layer.

According to the embodiments of the present disclosure, the hydrogen-free insulating layer is disposed between the oxide semiconductor layer and the gate electrode in a driving thin film transistor using an oxide semiconductor layer, so that a margin for a distance between the oxide semiconductor layer and the gate electrode is secured by increasing a parasitic capacitance between the oxide semiconductor layer and the gate electrode and performance of the driving thin film transistor is improved by increasing the S-factor of the driving thin film transistor.

According to the embodiments of the present disclosure, the hydrogen-free insulating layer is disposed between the light blocking layer and the oxide semiconductor layer in a driving thin film transistor using an oxide semiconductor layer, preventing a short circuit between the light blocking layer and the oxide semiconductor layer and degradation in performance of elements due to hydrogen and blocking moisture permeation to secure reliability.

Effects according to the embodiments of the present disclosure are not limited to the above-mentioned effects, and more diverse effects are included in the present disclosure.

What is claimed is:

1. An organic light emitting display device comprising:
a light emitting element;
a driving transistor configured to provide a driving current to the light emitting element and including a first oxide semiconductor layer and a first gate electrode disposed on the first oxide semiconductor layer;
a first light blocking layer overlapping the first oxide semiconductor layer under the first oxide semiconductor layer, the first light blocking layer on a first insulating layer made of a silicon nitride material; and
at least one insulating layer disposed between the first light blocking layer and the first gate electrode and made of a hydrogen-free silicon nitride material different from the silicon nitride material of the first insulating layer.

2. The organic light emitting display device of claim 1, further comprising:
a first switching transistor electrically connected to the driving transistor and including a second oxide semiconductor layer and a second gate electrode disposed on the second oxide semiconductor layer.

3. The organic light emitting display device of claim 2, further comprising:
a second light blocking layer overlapping the second oxide semiconductor layer under the second oxide semiconductor layer.

4. The organic light emitting display device of claim 3, wherein one of the at least one insulating layer is disposed between the second light blocking layer and the second gate electrode.

5. The organic light emitting display device of claim 3, wherein a distance between the first light blocking layer and the first oxide semiconductor layer is smaller than a distance between the second light blocking layer and the second oxide semiconductor layer.

6. The organic light emitting display device of claim 3, further comprising:
a second switching transistor electrically connected to the first switching transistor and including a polycrystalline semiconductor layer and a third gate electrode disposed on the polycrystalline semiconductor layer.

7. The organic light emitting display device of claim 6, wherein the third gate electrode is disposed in the same layer and made of the same material as the second light blocking layer.

8. The organic light emitting display device of claim 6, further comprising:

at least one silicon nitride layer disposed between the third gate electrode and the first oxide semiconductor layer.

9. The organic light emitting display device of claim 8, wherein the silicon nitride layer is not in contact with the first oxide semiconductor layer.

10. The organic light emitting display device of claim 3, further comprising:

a capacitor including a first electrode disposed in the same layer and made of the same material as the first light blocking layer and a second electrode disposed in the same layer and made of the same material as the second light blocking layer.

11. The organic light emitting display device of claim 3, wherein the second light blocking layer is electrically connected to the second gate electrode to form a dual gate of the first switching transistor.

12. The organic light emitting display device of claim 2, wherein the first gate electrode and the second gate electrode are disposed in the same layer and made of the same material.

13. The organic light emitting display device of claim 2, wherein one of the at least one insulating layer contacts lower surfaces of the first oxide semiconductor layer and the second oxide semiconductor layer.

14. The organic light emitting display device of claim 2, wherein one of the at least one insulating layer is disposed between the second oxide semiconductor layer and the second gate electrode and between the first oxide semiconductor layer and the first gate electrode.

15. The organic light emitting display device of claim 1, wherein the driving transistor includes a first source electrode and a first drain electrode connected to the first oxide semiconductor layer, and wherein the first source electrode is connected to the first light blocking layer.

16. The organic light emitting display device of claim 1, wherein one of the at least one insulating layer is disposed between the first oxide semiconductor layer and the first gate electrode.

17. The organic light emitting display device of claim 16, further comprising:

a first buffer layer and a second buffer layer disposed between the first oxide semiconductor layer and the first light blocking layer.

18. The organic light emitting display device of claim 17, wherein the first buffer layer is made of a silicon nitride material, and the second buffer layer is made of a silicon oxide material.

19. The organic light emitting display device of claim 18, wherein the second buffer layer is disposed on the first buffer layer.

20. The organic light emitting display device of claim 18, wherein the first buffer layer covers both top and side surfaces of the first light blocking layer.

21. The organic light emitting display device of claim 18, wherein the first buffer layer does not contact the first oxide semiconductor layer.

22. The organic light emitting display device of claim 1, wherein one of the at least one insulating layer is disposed between the first light blocking layer and the first oxide semiconductor layer.

23. The organic light emitting display device of claim 22, further comprising:

a silicon oxide layer disposed between the first oxide semiconductor layer and the first gate electrode.

24. The organic light emitting display device of claim 1, wherein the first light blocking layer is larger in size than the first oxide semiconductor layer so as to completely overlap the first oxide semiconductor layer.

* * * * *